INVENTORS
KATSUO SATO
TOSHIAKI IRIE
BY
OSTROLENK, FABER, GERB & SOFFEN
ATTORNEYS

INVENTORS
KATSUO SATO
TOSHIAKI IRIE
BY
OSTROLENK, FABER, GERB & SOFFEN
ATTORNEYS

United States Patent Office 3,424,956

Patented Jan. 28, 1969

3,424,956

DIFFUSION TYPE SEMICONDUCTOR DEVICE HAVING PLURAL PROTECTIVE COATINGS

Katsuo Sato and Toshiaki Irie, Tokyo, Japan, assignors to Nippon Electric Company Limited, Tokyo, Japan Continuation-in-part of application Ser. No. 301,856, Aug. 13, 1963. This application Sept. 28, 1966, Ser. No. 584,622

U.S. Cl. 317—234 16 Claims

Int. Cl. H01l 3/00, 5/00

ABSTRACT OF THE DISCLOSURE

A method for forming protective coatings upon semiconductor bodies, which coatings are applied at least to those exposed regions constituting the interface of a P-N junction wherein a first protective coating of silicon monoxide of a predetermined thickness is formed immediately upon the surface of the semiconductor body and immediately subsequent thereto a second coating of silicon dioxide of suitable thickness is formed. The coatings are either formed so as to mask the junction terminals or the coatings are etched to provide contacting surfaces for electrode leads. The composite assembly is then further encapsulated within a suitable resin to provide a composite structure in which the sensitive interfaces of the structure are protected against deterioration or contamination and wherein the intermediate coating or layer of silicon mono-oxide mitigates the differences in expansion coefficients of the semiconductor body and the silicon dioxide layer so as to prevent any breakage or deterioration of the semiconductor body. The final composite encapsulation provides suitable protection against the elements as compared with conventional techniques while providing an overall volume which is many times smaller than the volume of encapsulation assemblies conventionally in use.

Figure 1A:
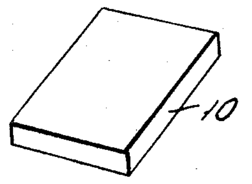

This application is a continuation-in-part of application Ser. No. 301,856 filed Aug. 13, 1963, now abandoned, in the names of Katsuo Sato and Toshiaki Irie and assigned to the assignee of the instant invention.

The instant invention relates to semi-conductor devices and more particularly to novel means for sealing miniaturized semi-conductor assemblies which are employed in micro-modules or other compact structures.

In the field of semi-conductor devices, such as, for example, transistors, diodes and solid-state circuits having semi-conductor base members, it is highly desirable that the space volume occupied by such devices be as small as possible so as to make more advantageous use of these devices in a variety of applications.

Since the P-N junction region, which is exposed on the surface of semi-conductor devices, such as transistors and diodes, is usually strongly affected by he atmosphere due to the activity of the semi-conductor surface, such devices are preferably enclosed in vacuum-tight envelopes which act to isolate such devices from external atmosphere to provide high reliability operation. Therefore, whenever high reliability operation becomes a significant requirement, miniaturization of such semi-conductor devices is subjected to the limitation in volume of the hermetically sealed envelope enclosing and sealing the device.

For example, while the dimensions of the element of a mesa transistor and the like are $(0.65)^2 \times 0.1$ mm.$^3$, or $4 \times 10^{-5}$ cm.$^3$, present techniques require, for devices of high reliability, that they be enclosed in a cylindrical vacuum-tight envelope having a diameter of 4 mm. and a height of 4 mm., such that the volume measures $5 \times 10^{-2}$ cm.$^3$. It can be seen from a comparison between the volume for the transistor against the volume for the vacuum-tight enclosure enclosure that the enclosure volume is approximately 1000 times greater than the transistor volume, thus providing an extremely large amount of unnecessary volume for the vacuum-tight enclosure.

Semi-conductor elements can be enclosed by means having as little as several times the volume of the element itself it is directly covered or coated with resin or glass. However, so long as the surface of the element is not treated with a suitable stabilizing material the deterioation of the semi-conductor characteristics is inevitable.

The means generally employed for such enclosure is that of coating resin or other protective material on the semi-conductor elements. Such protective coatings have the requirement that they must not influence or deteriorate the active surface of the semi-conductor since, if such a coating method is used, any impurities absorbed on the surface due to the results of etching, washing and drying are retained within the semi-conductor device and further, if the boundary plane forming the inter-face between the semi-conductor surface and the protective coating is not ideally joined it will give rise to a deterioration in the influence of an external atmosphere.

As one means of providing equilibrium against the effects of the atmosphere in an impurity-diffusion type semiconductor employing silicon, a silicon dioxide ($SiO_2$) film is formed on the surface during the stage in which the P-N junction is grown in impurity-diffusion with the provision of heat at approximately 1200° C. upon the silicon base, which operation is carried out in an oxidizable atmosphere. However, in semi-conductor devices employing germanium, an oxidized film (germanium oxide) formed by such a procedure is not hydrophobic and is non-solid, so that it is impossible for the element to be stabilized against atmospheric conditions.

Therefore, in dealing with semi-conductor devices employing germanium, it is necessary to provide a chemically stable silicon dioxide film. In order to form such a silicon dioxide film on the surface of a germanium base, several methods may be employed, such as, for example, vacuum evaporation, sputtering, electron beam bombardment, or other thermal resolution of organic silicon compounds. Thus, in order to grow an ideal junction on the surface of a semi-conductor device, it is necessary to maintain it in a high vacuum and high temperature state.

However, since a significant difference in thermal expansion coefficient exists between germanium, silicon and silicon dioxide, which coefficients are, respectively, $$6 \times 10^{-6}(\text{deg.}^{-1})$$

or $4.2 \times 10^{-6}(\text{deg.}^{-1})$ vs. 4 to $5 \times 10^{-7}(\text{deg.}^{-1})$, distortion on the boundary surface is bound to occur during the cooling process following the film forming or thereafter during a thermal cycle in the construction process of the element, thereby causing a deterioration of the characteristics of the semi-conductor and in addition, giving rise to possible cracks in the silicon dioxide film.

The instant invention provides a novel casing assembly which overcomes the above mentioned disadvantages by providing a first film coated upon the surface of the semi-conductor device which has a coefficient of thermal expansion which is extremely close to that of the semi-conductor device and further providing a second film of a chemically stable material whereby the first film substantially mitigates the significantly different characteristics and physical properties between the semi-conductor element and the second film.

The instant invention is comprised of a suitable casing assembly for semi-conductors, such as germanium transistors, diodes and the like, wherein the semi-conductor device is first coated by forming a silicon mono-oxide on the semi-conductor base plate, which composition has a thermal expansion coefficient which is only slightly different from that of the semi-conductor material. Thereafter, a second film of chemically stable silicon dioxide is placed over the first film whereby the first film substantially reduces the effects of the significantly different physical properties between the second film and the semi-conductor device. These coatings completely avoid the need for the hermetically sealed envelope by providing all the necessary functions which such hermetically sealed envelopes perform, while at the same time enabling both the semi-conductor device and its connecting lead wires to be substantially enclosed within a resinous material without deteriorating the specifications and characteristics of the device which may occur due to the environmental stabilization of the element surface which is subjected to such a resinous coating.

The casing assembly of the instant invention further completely alleviates the need for the highly technical engineering requirements of the sealing process necessary for the provision of a conventional hermetically sealed envelope and further alleviates the need for designing a highly miniaturized hermetically sealed envelope, thus substantially lowering the costs involved in casing semi-conductor devices.

It is therefore one object of the instant invention to provide a novel casing for semi-conductor devices and the like, which casing assembly provides adequate hermetic sealing for the semi-cinductor device.

Still another object of the instant invention is to provide a novel casing for semi-conductor devices and the like which occupy substantially less volume than conventionally employed in hermetically sealed envelopes of the prior art.

Another object of the instant invention is to provide a novel casing for semi-conductor devices and the like wherein the casing is comprised of a first film coated upon the semi-conductor surface, which film has a coefficient of expansion substantially similar to that of the contacting semi-conductor device.

Another object of the instant invention is to provide a novel casing for semi-conductor devices and the like wherein the casing is comprised of a first film coated upon the semi-conductor surface, which film has a coefficient of expansion substantially similar to that of the semi-conductor device and a second film which provides equilibrium against atmospheric effects to provide a highly reliable semi-conductor device by preventing any deterioration of the semi-conductor characteristics.

Still another object of the instant invention is to provide a novel casing for semi-conductor devices and the like wherein the casing assembly is comprised of a first film of silicon mono-oxide coated upon the semi-conductor devices.

Still another object of the instant invention is to provide a novel casing for semi-conductor devices and the like wherein the casing assembly is comprised of a first film of silicon mono-oxide coated upon the semi-conductor device and a second film of stabilized silicon dioxide based upon said first film for preventing deterioration of the semi-conductor characteristics due to atmospheric effects.

Figure 9:
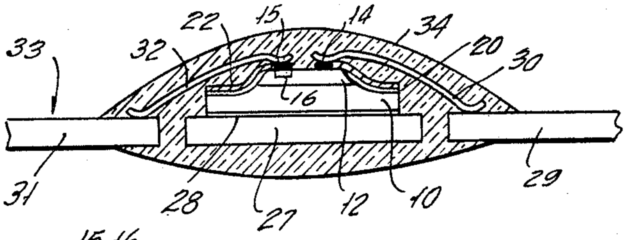
Figure 8:
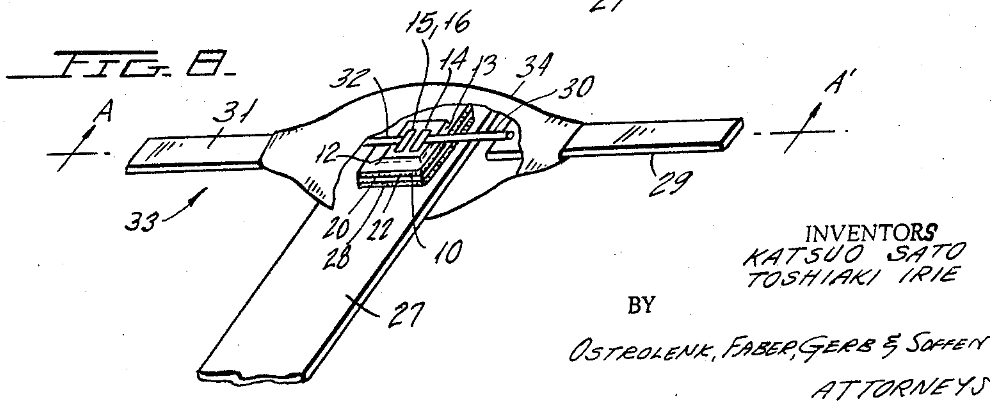

These and other objects of the instant invention will become apparent when reading the accompanying description and drawings, in which:

FIGURES 1–7 inclusive, are sequential illustrations of the process of the instant invention employed upon a germanium mesa transistor;

FIGURE 8 is a perspective view of the end product embodying the principles of the instant invention showing a portion thereof partially in section; and FIGURE 9 is a sectional view taken along lines A—A′ of FIGURE 8. The designating numerals of the figures are to be construed as identifying the same elements or elements of similar properties throughout the figures.

The following is a description of an example of actual application of the invention to a germanium transistor.

Figure 1B:

The first step of the procedure is that of preparing a base member of germanium having an excellent mirror-polished surface. In this exemplary embodiment the thickness is considered adequate within the range of 0.120 to 0.100 mm. and the surface area is 4 cm.$^2$. FIGURE 1A shows such a germanium base member 10 which will be employed as the collector region, in a manner to be more fully described, while FIGURE 1B shows a sectional view of the base member 10. The mirror-polished surface is the top surface 12*a*. It should be understood that any other suitable dimensions for the germanium base member may be chosen, the dimensions given herein being merely exemplary.

The germanium base plate has a specific resistance of approximately 1 ohm-cm. As can best be seen from a consideration of FIGURES 2A and 2B, the germanium base plate 10 is a P-type base plate having a diffused N-type region 12 so as to form an interface 13 therebetween. FIGURE 2B shows a sectional view of FIGURE 2A.

Figure 2A:
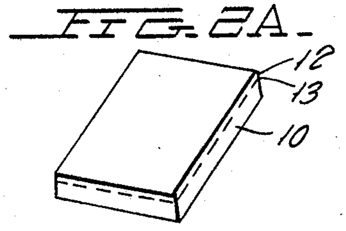
Figure 2B:
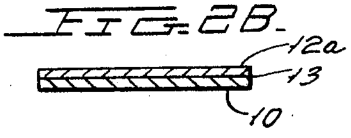

The step of the process which forms the structure of FIGURES 2A and 2B is that of diffusing impurities, such as, for example, antimony or arsenic and the like upon the mirror-polished surface 12*a* of the P-type germanium base plate by means of exposing it in a hydrogen atmosphere from 10 to 100 minutes in an ambient temperature of 600–700° C., thus forming a P-N junction 13 having a depth of approximately 1 micron distance from the mirror surface 12*a*. FIGURES 2A and 2B show the N-type region 12 formed by the impurity diffusion and 13 shows the interface which is the P-N junction.

Figure 3A:
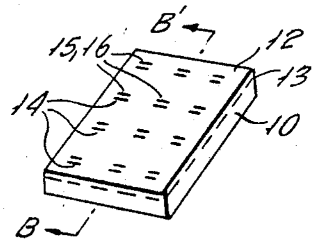
Figure 3B:
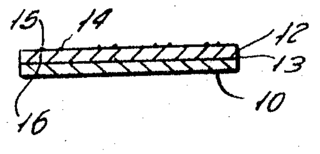

The next step of the process is that of forming the emitter region and the emitter and base electrodes. FIGURES 3A and 3B show perspective and sectional views for forming a plurality of many semi-conductor elements within a single base plate wherein the elements 14 are the base electrodes, the elements 15 are the emitter electrodes and 16 shows the emitter region. The emitter region, the emitter electrode and the base electrode all have an area of approximately 25 microns x 50 microns and are formed by the method of vacuum evaporation. The emitter region 16 has the P-type conductivity and may be formed by alloying germanium with aluminum or by selectively diffusing an impurity such as boron into the base region 12. FIGURE 3B shows the assembly of FIGURE 3A taken along the line B—B′.

Mesa-type transistors are normally provided with sufficient surface areas of, for example, 100 microns x 80 microns ($8 \times 10^{-5}$ cm.$^2$) in order to provide adequate collector capacity in the neighborhood of the emitter and base electrodes with the residual material being removed until the collector base junction is exposed at the depth of 1–10 microns from the surface. The removal operation is performed by means of a chemical etching process.

Figure 4A:
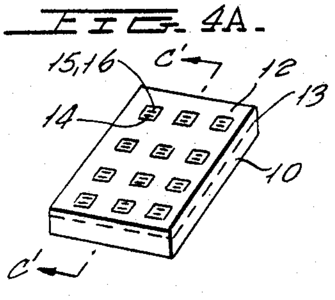
Figure 4B:
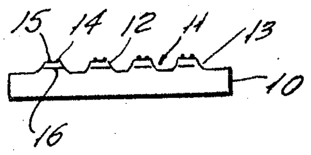
Figure 4C:
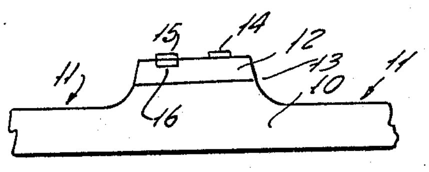

FIGURE 4A shows an arrangement wherein a plurality of such mesa-type elements are formed upon a single base element. It should be understood that as many as 500–1000 such elements may be formed upon a single base plate. FIGURE 4B shows a sectional view of FIGURE 4A taken along the lines C—C′. FIGURE 4C shows an enlarged view of one such element of FIGURE 4B. FIGURES 4B and 4C clearly show the manner in which the residual material is removed from the regions 11 between adjacent elements.

The next step of the operation is that of cutting the base plate 10 so as to form a plurality of individual elements each being substantially of pellet size and then placing such elements in a sealed case directly. However, in line with the instant invention, this step is delayed and substituted by the next step which is that of taking the entire base plate before it is cut up into individual elements of pellet size and forming the silicon mono-oxide (SiO) and silicon dioxide ($SiO_2$) which are formed on the base plate.

Figure 5A:
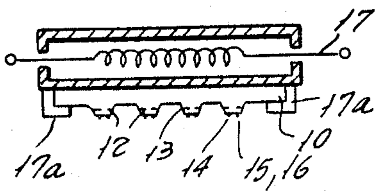

While the films of silicon monooxide and silicon dioxide may be formed by any known means, such as vacuum evaporation, sputtering, electron beam bombardment, or thermal resolution of the organic silicon compounds, in the instant example the operation employed is that of vacuum evaporation. FIGURE 5A shows the germanium base plate after the mesa etching process together with the equipment employed for applying the silicon mono- and silicon dioxide films.

After the mesa etching process, the following pretreatment of the base plate 10 is performed before evaporation of silicon oxide.

In order to improve the stability of transistor characteristics, it is necessary to thoroughly remove chemical substances which inevitably remain on the surface of the base plate after the mesa etching process where the well known etchant CP–4 solution (mixture of hydrofluoric acid 15 parts, nitric acid 25 parts, acetic acid 15 parts, and bromine 0.3 part in volume) is used. For this purpose, the germanium base plate, after being subjected to the etching process, is washed in purified water at room temperature for 30 to 60 minutes.

The base plate is then rinsed in an organic solvent such as distilled trichlene (trichloroethylene), acetone, or the like to remove the layer of wax covering the electrode portions of the mesa, and subsequently dipped in sodium hydroxide 10% aqueous solution for 5 seconds so as to etch off minute metallic particles deposited on the mesa top surface (other than the electrode portions) during evaporation of aluminum for forming the emitter electrode. The base plate is again washed in purified water under the same conditions as the former washing, preferably by way of an ultrasonic cleaning method and then is dried by blowing dry nitrogen gas upon the base plate. In order to remove water vapor from the germanium surface which may otherwise prevent the adhesion of silicon mono-oxide to germanium, the base plate is heated in a dry nitrogen atmosphere at 100° C.

After these pre-treatments, the base plate is loaded in a vacuum chamber (not shown) which in turn is equipped with an ion gettering pump (not shown). Then, the vacuum chamber is evacuated to $10^{-6}$ mm. Hg or lower pressure.

Initially the base plate 10 is heated by a suitable heating device 17 having suitable structures **17*a* for supporting the base plate 10 adjacent thereto. During the time in which the vacuum chamber is being evacuated, the base plate is heated for 10 minutes at the maximum possible temperature level which lies just below the eutectic point of base electrode metal Au and germanium, in order to remove gaseous matter from the germanium surface and to ensure the adhesion of silicon mono-oxide to germanium. The temperature is raised to the range of 300–330° C., which range is chosen so as to be harmless to the semi-conductor characteristics. The heating operation takes place in a vacuum chamber (not shown) which is maintained at a vacuum on the order of $10^{-6}$ mm. Hg so as to fully exhaust the adsorbed gases. Secondly, the silicon mono-oxide 21, which is shown in FIGURE 5C, is placed in a graphite crucible 19 and is heated to 1250° C. by means of a suitable heating filament 18 within an atmosphere of $10^{-6}$ mm. Hg which is the same atmosphere in which the base plate 10 is placed. Upon heating, the silicon mono-oxide evaporates onto the germanium base plate 10** which has already been processed by mesa etching. It is important during this operation to maintain the base plate at the temperature of 300–330° C. during the evaporation process. The evaporation at room temperature results in a poor SiO film containing many defects such as pin holes, which are harmful for stabilization of transistor characteristics.

Electrical and physical properties of the evaporated SiO film changes with evaporating conditions such as evaporating rates, the degree of vacuum, and the like. The evaporation at a low evaporating rate or for a long time and in a low degree of vacuum causes SiO to be converted to $SiO_2$. High temperature heating in an oxygen atmosphere also results in such conversion. In order to avoid such conversion of the SiO layer and to prevent the release of contamination from the heat source, the high rate evaporation of, for example, 25–40 A./sec. is preferable due to its advantageous results.

The evaporated volume is easily controlled by regulating the relative distance between the base plate 10 and the crucible 19 as well as the evaporation time. In the instant example, these variables were so controlled as to provide a 6000 A. thickness of silicon mono-oxide film upon the base plate 10. This was obtained by separating the base plate 10 and the crucible 19 a distance of approximately 7 cm., for a period of from 2.5–4 minutes.

Occurrence of defects such as pin holes in the evaporated SiO film must be prevented, because they are harmful to the stabilization of transistor characteristics. Pin holes can be detected by inspection through the use of chlorine gas. More specifically, when the germanium base plate covered with SiO film is heated in a chlorium atmosphere at 800–850° C. for 5–30 minutes, the chlorine molecules pass through the pin holes and attack the germanium surface, leaving vapor-etched pits in the SiO film, which pits can be observed through a microscope. This inspection makes it possible to readily determine pin hole locations, pin hole sizes, and number of the pin holes. Table 1 shows the results of inspection of the pin holes for different thicknesses of SiO film.

TABLE 1

| Thickness of SiO evaporated film, A.: | Number of detected pin holes |
|---|---|
| 1,500 | >300 |
| 3,000 | 200 to 300 |
| 4,500 | 30 to 40 |
| 6,000 | 5 to 10 |
| 10.000 | 3 to 6 |
| 12,000 | 0 |

NOTE.—The diameter of the Ge plate is 20 mm. and evaporating rate is 50 A./sec.

These results indicate that the number of the pin holes markedly depends on the thickness of the film. An SiO film of no greater than 6,000 A. is sufficient from a practical viewpoint for protecting the base plate from the outer atmosphere, when taking into account the thickness of $SiO_2$ film to be deposited on the SiO film in the succeeding process.

After evaporation of SiO for 2.5–4 minutes, the operating conditions are then kept constant with the exception that the pressure of the vacuum chamber (not shown) is increased up to about $10^{-3}$ mm. Hg, by introducing oxygen gas into the chamber through a leak valve connected to an oxygen source through a suitable conduit piping (not shown), such that the silicon mono-oxide is then easily transformed to silicon dioxide at that stage of the evaporation, consequently leading to the formation of a silicon dioxide film layer upon the silicon mono-oxide film. The evaporation volume of the silicon dioxide is easily controlled by the time during which the vacuum of $10^{-3}$ mm. Hg is maintained within the vacuum chamber. After the $SiO_2$ film reaches a specific thickness by maintaining the evaporation process for a period of 1–2 minutes, power supplied to the filament 17 is switched off. In the instant example, the thickness obtained is 3000 angstroms.

Figure 5B:
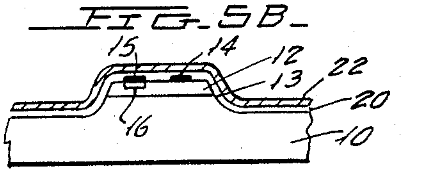
Figure 5C:
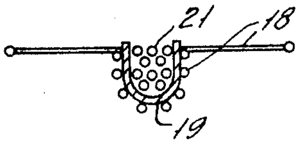

FIGURE 5B shows an enlarged sectional view of the base plate 10 after the formation of the silicon mono-oxide and silicon dioxide films wherein the silicon mono-oxide film is designated by the numeral 20 and the silicon dioxide film is designated by the numeral 22.

Figure 6:
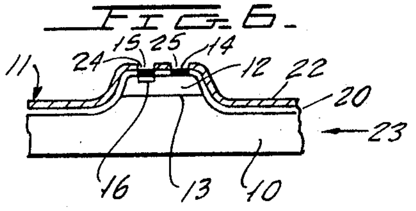

After the operations forming the first and second films, the silicon mono-oxide and silicon dioxide films which are coated upon the base electrodes 14 and the emitter electrodes 15 are removed by any well known photo-etching method so as to provide for connection of lead wires thereto. The germanium base plate 10 is then cut up into a plurality of individual elements all of substantially pellet size and shape. In the exemplary embodiment given herein the dimensions are approximately 0.5 mm. x 0.5 mm. FIGURE 6 illustrates one particular pellet 23 showing the etched sections 24 and 25 wherein the silicon monoxide and silicon dioxide films have been removed from the region above the emitter and base electrodes 15 and 14, respectively.

Germanium mesa transistor pellets prepared in the above manner were tested under various conditions to ascertain the stability of their characteristics. Table 2 shows the results obtained. These results indicate that encapsulated transistors of excellent stability are produced.

TABLE 2

| Test Condition | Characteristics: Initial | Characteristics: After 1,000 hours |
|---|---|---|
| Power Aging Test (75 mw.): | | |
| $I_{CBO}$ (−15 v.) μA | 1.6–3.5 | 1.8–2.6 |
| $I_{EBO}$ (−0.1 v.) μA | 0.5–1.1 | 0.5–1.1 |
| $h_{fe}$ (6 v., 2 ma.) | 5–13 | 8–15 |
| Temperature Storage Test (85° C.): | | |
| $I_{CBO}$ μA | 2.4–4.0 | 2.2–4.5 |
| $I_{EBO}$ μA | 0.6–1.8 | 0.8–1.9 |
| $h_{fe}$ | 7.5–13 | 7–13 |
| Weather Test (2 months): | | |
| $I_{CBO}$ μA | 2.2–3.3 | 2.2–3.1 |
| $I_{EBO}$ μA | 0.4–0.8 | 0.5–0.85 |
| $h_{fe}$ | 6–11 | 5.5–9.5 |
| Temperature Humidity Test (80° C., 95% RH): | | |
| $I_{CBO}$ μA | 0.9–2.0 | 1.2–3.0 |
| $I_{EBO}$ μA | 0.2–0.8 | 0.3–0.9 |
| $h_{fe}$ | 10–20 | 8.5–18 |

It is found by use of an inspection procedure for pin holes similar to that used for inspecting the SiO film, that a thickness of $SiO_2$ film of greater than 1000 A. is favorable. Furthermore, it has been confirmed that the thicknesses of the SiO and the $SiO_2$ film must be less than 12,000 A. and 6000 A., respectively, in order to prevent distortion along the boundary surfaces, which distortion is otherwise caused by differences in thermal expansion coefficient of these films.

Since the SiO and $SiO_2$ films are not merely placed on the germanium but strongly adhere to the germanium, no contamination enters into the interface between the SiO film and germanium. Accordingly, the SiO and $SiO_2$ films may be formed not only over the whole surface of the base plate but alternatively may be selectively placed only on those portions of the base plate where the P-N junctions are exposed, if desired. Such partial films may be formed by selective evaporation through a mask.

Figure 7A:
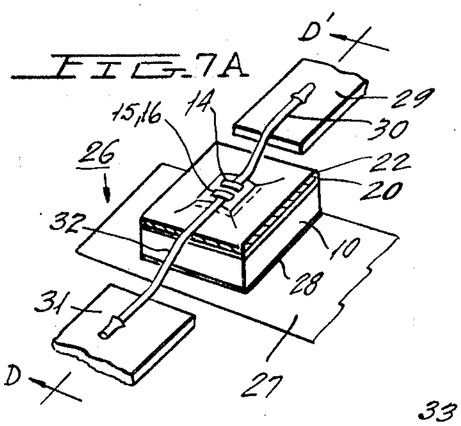
Figure 7B:
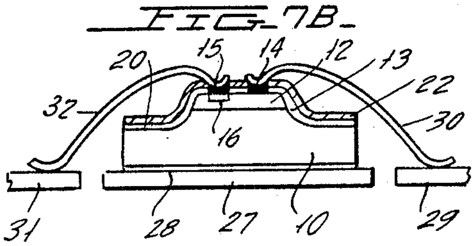

FIGURE 7A illustrates a completed embodiment 26, while FIGURE 7B shows a sectional view taken along the lines D—D' of FIGURE 7A. In this view the collector lead 27 is secured to the base plate 10 by means of an adequate solder material 28 which is applied at a temperature of 350–400° C. A base lead 29 is provided and is connected to the base electrode 14 by means of a gold wire 30 having a diameter of approximately 10 microns and which is connected individually to both the base lead 29 and base electrode 14 in a temperature range of 300° C. employing a thermal compression bonding or ultrasonic compression bonding operation. The emitter lead 31 is connected to the emitter electrode 15 by means of a similar gold wire 32 using similar bonding methods to those described above with regard to gold wire 30.

In the above structure, lead wires 29 and 31 may be omitted by providing gold wires 30 and 32 which are connected to the base electrode 14 and emitter electrode 15, respectively, which gold wires have sufficient mechanical strength so as to be used themselves as the external terminals of the mesa-type transistor.

As the final step, the mesa-type transistor which has been constructed in accordance with the developmental process, shown in FIGURES 1–7, is then covered with a suitable resinous material 34 so as to form the composite structure 33 shown in FIGURES 8 and 9. As can be seen therein, the resin 34 completely covers the gold wires 30 and 32 so as to endow them with such mechanical strength as to resist any damage thereto during the handling, transporting or usage of the transistor assembly. The resin selected is chosen to have small expansion and compression in the polymerization thereof. For example, epoxy resin, high thermal-resistive resin, such as silicone resin, and resins of excellent high frequency dielectric characteristics, such as fluoride resin, are suitable selections. It should be understood that these selections are merely exemplary and any other suitable resins having similar characteristics may be employed. In the composition of these resins a layer by layer buildup on the device is also desirable in the formation of the complete assembly 33.

In this examplary embodiment, the pellet is thoroughly coated with 5% solution of the Silicone Varnish (XR6–2044 produced by Dow Corning Corp.), diluted with xylene and then dried in air for 1 hour. The assembly is again dried in an oven at 125° C. for 1 hour. Next, the assembly is coated with epoxy resin (#5603 Epoxy Pellet produced by Joseph Waldman & Son Co.). The assembly is heated at 200° C. for 5 minutes to release any bubbles and then baked, to cure the resin, at 125° C. for 2 hours and finally baked at 150° C. for 3 hours. The Silicone Varnish coating process is applied to the epoxy resin under the same conditions as set forth above.

Whereas the above described method relates to that of treating a germanium mesa-type transistor, it should be understood that this description is merely examplary and the above method may be employed with equal effectiveness to other types of semi-conductor devices such as a planar type semi-conductor device, diode devices, and solid-state devices especially in the field of micromodule components.

Although there has been described a preferred embodiment of this novel invention, many variations and modifications will now be apparent to those skilled in the art. Therefore, this invention is to be limited, not by the specific disclosure herein, but only by the appended claims.

What is claimed is:

1. A method for encapsulating semiconductor devices comprising the step of providing a semiconductor device comprising a base plate of a material taken from the group consisting of germanium and silicon having at least one impurity-diffused region;

forming at least one electrode upon the exposed surface of said impurity-diffused region;

heating the impurity-diffused base plate structure to a temperature in the range from 300 to 350° C. in a vacuum below $10^{-6}$ mm. Hg and simultaneously forming by vacuum evaporation a first layer of a silicon monoxide at least on the portion of the surface of said base plate where the interface between said impurity-diffused region and the adjacent region of said base plate are exposed, the source of said silicon monoxide being heated to a temperature of approximately in the range from 1200 to 1300° C. for a first predetermined time period;

increasing the degree of vacuum to approximately $10^{-3}$ mm. Hg at the end of said first time period to form a second layer of a silicon dioxide upon said first layer, while maintaining the resulting structure and said source at temperatures in the range from 300 to 350° C. and from 1200 to 1300° C., respectively.

2. The method of claim 1 further comprising the steps of removing said first and second layers in the region of said electrode by an etching process;

securing a conductive lead to each electrode;

encapsulating the entire structure with a resinous material with the exception of each outer portion of the lead to facilitate their electrical connection in a circuit.

3. A method for encapsulating semiconductor devices having a P–N junction comprising the steps of providing a germanium base plate having at least one mirror-polished surface;

diffusing an impurity taken from the group consisting of antimony, arsenic and phosphorous upon the surface of the doped germanium base plate in an ambient temperature in the range from 600–700° C. for a period in the range from 10 to 100 minutes;

forming at least one electrode on the surface of the diffused portion of said germanium base by vacuum evaporation;

heating the resulting structure to a temperature in the range from 300–330° C. in a vacuum below $10^{-6}$ mm. Hg and simultaneously forming a silicon monoxide layer on the region of said resulting structure to coat the resulting structure at least on the exposed surface of P-N junction with silicon monoxide by vacuum evaporation;

increasing the degree of vacuum to approximately $10^{-3}$ mm. Hg to form a silicon dioxide layer upon said silicon monoxide layer;

removing the silicon monoxide and dioxide layers on the region of said at least one electrode by a photo etching process;

soldering leads to said at least one electrode at a temperature level in the range from 300–400° C.;

completely sealing the structure with a resinous material to form a composite structure having the leads exposed for suitable connection into an electrical circuit.

4. The method of claim 3 wherein the step of forming a silicon monoxide layer is further comprised of providing a silicon monoxide source heated to a temperature in the range from 1200 to 1300° C. and positioning said source in close proximity to the region of the resulting structure to be coated.

5. A method for encapsulating semiconductor devices having a P-N junction comprising the steps of providing a base plate of doped germanium having at least one mirror-polished surface;

diffusing an impurity taken from the group consisting of antimony, arsenic and phosphorous upon the surface of the germanium base plate to form a P-N junction beneath the mirror-polished surface of said doped germanium plate in an ambient temperature of 600–700° C. for a period in the range from 10 to 100 minutes;

forming an electrode for each device on one surface of said germanium plate by vacuum evaporation;

removing a portion of said germanium base plate surrounding said diffused region to a depth below said P-N junction by a chemical etching process;

heating the resulting structure to a temperature in the range of 300–330° C. in a vacuum below $10^{-6}$ mm. Hg and simultaneously therewith forming a silicon monoxide layer on a region of said resulting structure to coat the resulting structure at least on the exposed surface of P-N junctions with silicon monoxide by vacuum evaporation;

increasing the vacuum pressure to approximately $10^{-3}$ mm. Hg to form a silicon dioxide layer upon said silicon monoxide layer;

removing the silicon monoxide and dioxide layers in the region of said at least one electrode by photo etching;

cutting said plate into a plurality of individual semiconductor devices;

soldering leads to the electrode of each device at a temperature level in the range from 350–400° C.;

completely sealing each device with a resinous material to form a composite structure having the leads exposed for suitable connection into an electric circuit.

6. The method of claim 5 wherein the step of forming a silicon monoxide layer is further comprised of providing a silicon monoxide source heated to a temperature in the range from 1200 to 1300° C. and positioning said source in close proximity to the region of the resulting structure to be coated.

7. A method for encapsulating semiconductor devices comprising the steps of:

providing a semiconductor device comprising a base plate of semiconductor material taken from the group consisting of germanium and silicon and having one substantially smooth surface plate of doped semiconductor material positioned upon said base plate;

diffusing an impurity into said base plate through said smooth surface;

forming at least one electrode upon said exposed smooth surface;

heating the resulting structure to a temperature in the range from 300–330° C. within an enclosed region maintained at a pressure of less than $10^{-6}$ mm. Hg;

forming a mono-oxide coating of the material of said base plate upon said base plate by heating a source of said material to a temperature of approximately 1250° C. in the region of said resulting structure being heated to form a first layer of the mono-oxide material upon the resulting structure by vacuum evaporation;

increasing the vacuum condition to less than $10^{-3}$ mm. Hg while maintaining resulting structure and material temperatures to form a second layer of a dioxide of the material of said second plate upon said first layer.

8. The method of claim 7 further comprising the steps of removing said first and second layers in the region of said electrode by an etching process;

securing a conductive lead to each electrode;

covering the entire structure with a resinous material with the exception of a portion of the leads to facilitate their electrical connection in a circuit.

9. The method of claim 7 wherein said impurity is taken from a group consisting of arsenic, antimony, and phosphorus.

10. A method for encapsulating semiconductor devices having a P-N junction comprising the steps of:

providing a base plate of a material taken from the group consisting of germanium and silicon and having a mirror-polished surface;

diffusing an impurity taken from the group consisting of antimony, arsenic and phosphorus upon the surface of the base plate in an ambient temperature of 600–700° C. for a period in the range from 10 to 100 minutes;

forming at least one electrode on the mirror polished surface of said base plate by vacuum evaporation;

removing a portion of said base plate which has been diffused and removing a portion of the undiffused region of said base plate adjoining the diffused region to a depth below the mirror surface by a chemical etching process;

heating the resulting structure to a temperature in the range of 300–330° C. within an enclosure maintained at a pressure of less than $10^{-6}$ mm. Hg;

placing silicon mono-oxide heated to a temperature of approximately 1250° C. in the region of said resulting structure being heated to coat the resulting structure with silicon mono-oxide by vacuum evaporation;

lowering the pressure level to less than $10^{-3}$ mm. Hg to form a silicon dioxide layer upon said silicon mono-oxide layer;

removing the silicon mono-oxide and dioxide layers in the region of said electrode by photo etching;

soldering leads to the electrodes at a temperature level in the range from 350–400° C.;

completely sealing the structure with a resinous material to form a composite structure having the leads exposed for suitable connection into an electrical circuit.

11. A method for encapsulating semiconductor devices having a P-N junction comprising the steps of;

providing a base plate of a material taken from the group consisting of germanium and silicon and having a mirror-polished surface;

diffusing an impurity taken from the group consisting of antimony, arsenic and phosphorous upon the surface of the germanium base in an ambient temperature of 600–700° C. for a period in the range from 10 to 100 minutes;

forming an electrode for each device on the surface of said semiconductor plate by vacuum evaporation;

removing a portion of said base plate which has been diffused and removing a portion of the undiffused region of said base plate adjoining the diffused region to a depth below the mirror-surface by a chemical etching process;

heating the resulting structure to a temperature in the range of 300–330° C. within an enclosure maintained at a pressure of less than $10^{-6}$ mm. Hg;

placing silicon mono-oxide heated to a temperature in the range from 1200 to 1300° C. in the region of the resulting structure being heated to coat the resulting structure with silicon mono-oxide by vacuum evaporation;

lowering the pressure level to less than $10^{-3}$ mm. Hg to form a silicon dioxide layer upon said silicon monooxide layer;

removing the silicon mono-oxide and dioxide layers in the region of said electrode by photo etching;

cutting the plate into a plurality of individual semiconductor devices;

soldering leads to the electrode of each device at a temperature level in the range from 350–400° C.;

completely sealing each structure with a resinous material to form a composite structure having the leads exposed for suitable connection into an electric circuit.

12. A semiconductor device being comprised of a germanium single crystal body having at least one impurity-diffused region forming a P-N junction between said region and an adjacent region of said body;

a first coating comprising a layer of silicon mono-oxide being vacuum-evaporated upon at least a portion of the surface of said body immediately adjacent the region of said P-N junction;

said first layer having a thickness ranging from 6000 to 12,000 angstroms;

a second coating comprising a layer of silicon dioxide being vacuum-evaporated upon said first coating and having a thickness ranging from 1000 to 6000 angstroms.

13. The semiconductor device of claim 12 further comprising a third coating of insulating material completely surrounding said semiconductor body and said first and second coatings.

14. A semiconductor device being comprised of a germanium single crystal body having at least one impurity-diffused region;

a P-N junction being formed between said region and an adjacent region of said body;

a first coating comprising a layer of silicon monoxide being deposited upon at least a portion of the surface of said body immediately adjacent the region of said P-N junction;

said first layer having a thickness in the range from 0.6 to 1.2 microns;

a second coating comprising a layer of siilcon dioxide being deposited upon said first coating and having a thickness in the range from 0.1 to 0.6 micron.

15. The semiconductor device of claim 14 further comprising a third coating of insulating material completely surrounding said semiconductor body and said first and second coatings.

16. The device of claim 15 wherein said third coating of insulating material is taken from the group consisting of silicon resin, epoxy resin, and fluoride resin.

No references cited.

JOHN W. HUCKERT, *Primary Examiner.*

R. F. POLISSACK, *Assistant Examiner.*

U.S. Cl. X.R.

317—235; 29—578, 588, 589, 590, 591